US008987093B2

(12) United States Patent
Harley et al.

(10) Patent No.: US 8,987,093 B2
(45) Date of Patent: Mar. 24, 2015

(54) MULTIGATE FINFETS WITH EPITAXIALLY-GROWN MERGED SOURCE/DRAINS

(71) Applicant: International Business Machines Corporation, Armonk, NY (US)

(72) Inventors: Eric C. Harley, Lagrangeville, NY (US); Judson Robert Holt, Wappingers Falls, NY (US); Alexander Reznicek, Troy, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 13/623,129

(22) Filed: Sep. 20, 2012

(65) Prior Publication Data

US 2014/0080275 A1     Mar. 20, 2014

(51) Int. Cl.
*H01L 21/336*     (2006.01)
*H01L 29/66*     (2006.01)
*H01L 29/78*     (2006.01)

(52) U.S. Cl.
CPC .... *H01L 29/66545* (2013.01); *H01L 29/66795* (2013.01); *H01L 29/785* (2013.01)
USPC ........... 438/283; 438/164; 438/400; 438/478; 257/E21.421

(58) Field of Classification Search
None
See application file for complete search history.

(56) References Cited

U.S. PATENT DOCUMENTS

| 8,062,948 | B2 | 11/2011 | Shin | |
|---|---|---|---|---|
| 8,124,465 | B2 | 2/2012 | Yagishita | |
| 2009/0289280 | A1 | 11/2009 | Zhang et al. | |
| 2009/0302372 | A1* | 12/2009 | Chang et al. | 257/327 |
| 2010/0184261 | A1* | 7/2010 | Yagishita | 438/157 |
| 2010/0219485 | A1 | 9/2010 | Chong et al. | |
| 2011/0284967 | A1 | 11/2011 | Cheng et al. | |
| 2012/0049201 | A1 | 3/2012 | Yamaguchi et al. | |

* cited by examiner

*Primary Examiner* — Angel Roman
(74) *Attorney, Agent, or Firm* — Steven M. Kellner; Joseph Petrokaitis

(57) ABSTRACT

Method of forming multi-gate finFETs with epitaxially-grown merged source/drains. Embodiments of the invention may include forming a plurality of semiconductor fins joined by a plurality of inter-fin semiconductor regions, depositing a sacrificial gate over a center portion of each of the plurality of fins, forming a first merge layer over a first end of each of the plurality of fins to form a first merged fin region, forming a second merge layer over the second end of each of the plurality of fins to form a second merged fin region, etching a portion of the first merged fin region to form a first source/drain base region, etching a portion of the second merged fin region to form a second source/drain base region, forming a first source/drain region on the first source/drain base region, and forming a second source/drain region on the second source/drain base region.

13 Claims, 18 Drawing Sheets

MULTIGATE FINFETS WITH EPITAXIALLY-GROWN MERGED SOURCE/DRAINS

BACKGROUND

The present invention generally relates to semiconductor devices, and particularly to the manufacture of epitaxially-grown source/drains of multi-fin finFETs.

Fin metal-oxide-semiconductor field effect transistor (Fin-MOSFET) is an emerging technology which provides solutions to metal-oxide-semiconductor field effect transistor (MOSFET) scaling problems at, and below, the 22 nm node. FinMOSFET structures include fin field effect transistors (finFETs) which include at least one narrow semiconductor fin gated on at least two opposing sides of each of the at least one semiconductor fin. FinFET structures may be formed on a semiconductor-on-insulator (SOI) substrate, because of the low source/drain diffusion, low substrate capacitance, and ease of electrical isolation by shallow trench isolation structures.

FinFET devices having multiple fins covered by a single gate (also known as multigate devices) have been developed to further maximize the surface area contact between the body region of the fins and the gate. The multiple fins of multigate devices may be merged on one end to form a single source/drain region. Merging the multiple fins may be accomplished by epitaxially grown source/drain material, such as silicon, on the fin surface. However, as semiconductor devices continue to decrease in size, the smaller spaces between the fins may lead to issues such as faceting when growing source/drain regions of multigate devices. Due to the nature of epitaxial growth and certain structural features of integrated circuit devices, faceting is the result of epitaxially grown regions exhibiting undesirably formed shapes that impact device performance and reliability. In the case of forming source/drain regions on SOI finFETs, epitaxial growth occurs primarily on the fin sidewalls. Sidewall growth can result in faceting, voids, and other defects where growths on opposing sidewalls meet. Therefore, a method of growing source/drain regions of multigate devices that may, among other things, avoid faceting is desirable.

BRIEF SUMMARY

The present invention relates to methods of forming multigate finFET devices with epitaxially-grown merged source/drains. According to at least one exemplary embodiment, the method may include first forming a plurality of semiconductor fins joined by a plurality of inter-fin semiconductor regions and depositing a sacrificial gate over a center portion of each of the plurality of fins The sacrificial gate may divide each of the plurality of fins into a body region covered by the sacrificial gate, a first end, and a second end separated from the first end by the body region and the sacrificial gate also divides each of the plurality of inter-fin semiconductor regions into a body region covered by the sacrificial gate, a first end, and a second end separated from the first end by the body region.

The method may then further include forming a first merge layer over the first end of each of the plurality of fins to form a first merged fin region, the first merged fin region comprising the first merge layer, the first end of each of the plurality of fins, and the inter-fin semiconductor regions between the first ends of the plurality of fins and forming a second merge layer over the second end of each of the plurality of fins to form a second merged fin region, the second merged fin region comprising the second merge layer, the second ends of the plurality of fins, and the inter-fin semiconductor regions between the second ends of the plurality of fins.

The method may then further include etching a portion of the first merged fin region to form a first source/drain base region, etching a portion of the second merged fin region to form a second source/drain base region, forming a first source/drain region on the first source/drain base region, and forming a second source/drain region on the second source/drain base region.

Figure 1A:
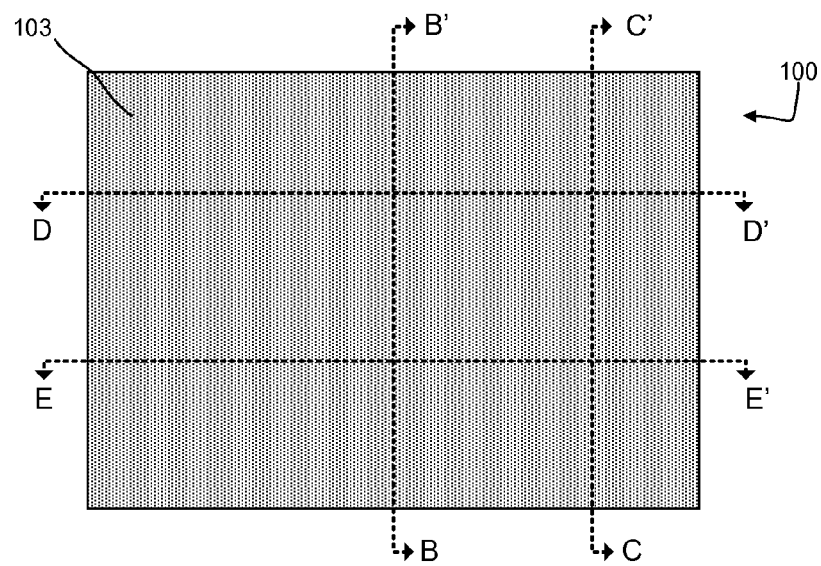
FIGS. 1A-1E depict various views of a silicon-on-insulator (SOI) substrate that may be used in one embodiment of the invention.
Figure 1B:
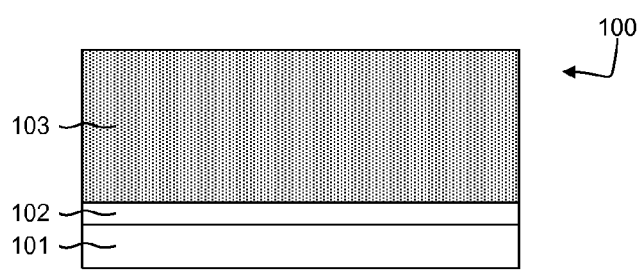
Figure 1C:
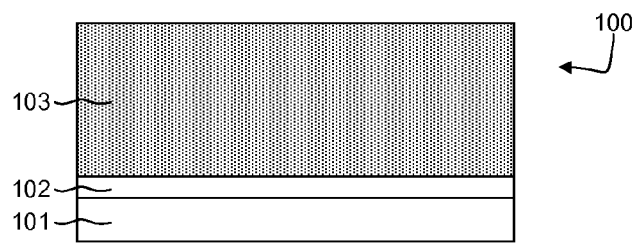
Figure 1D:
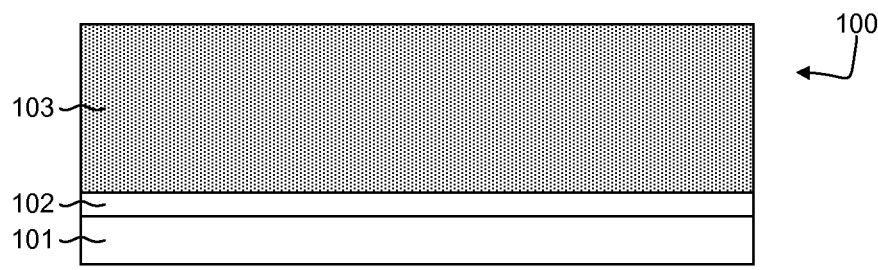
Figure 1E:
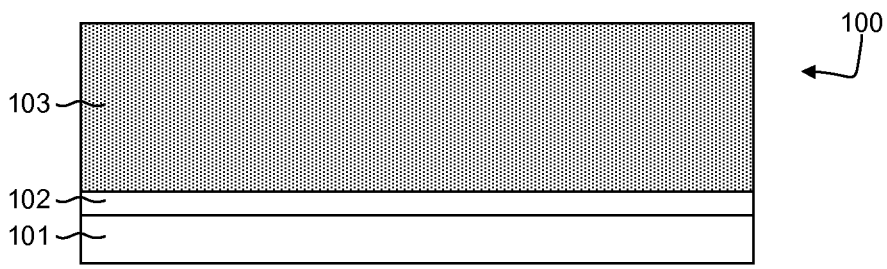
Figure 2A:
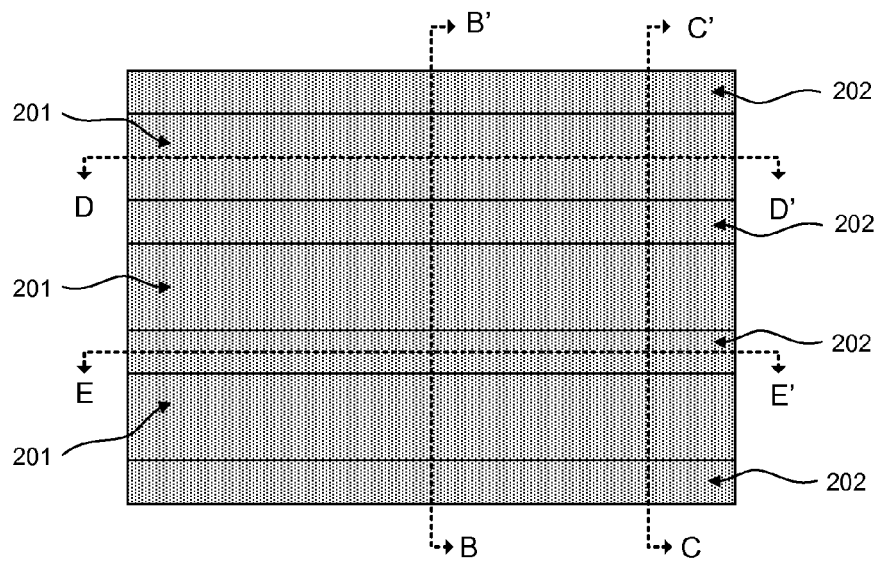
FIGS. 2A-2E depict etching the semiconductor substrate layer of the SOI substrate of FIGS. 1A-1E to form a plurality of semiconductor fins joined by inter-fin semiconductor regions.
Figure 2B:
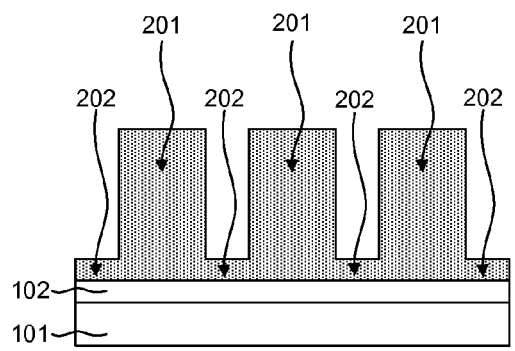
Figure 2C:
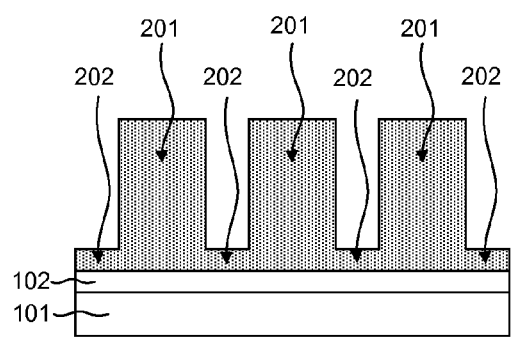
Figure 2D:
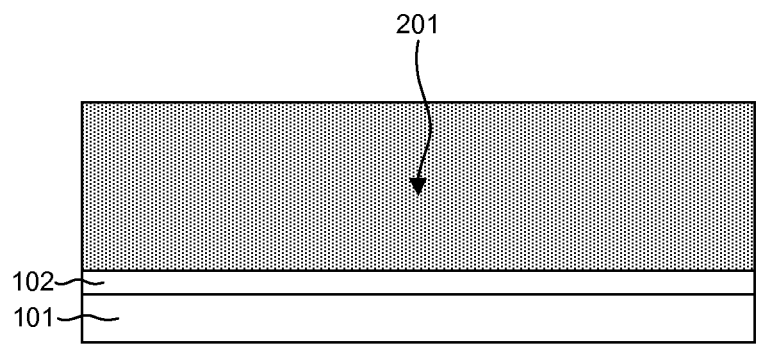
Figure 2E:
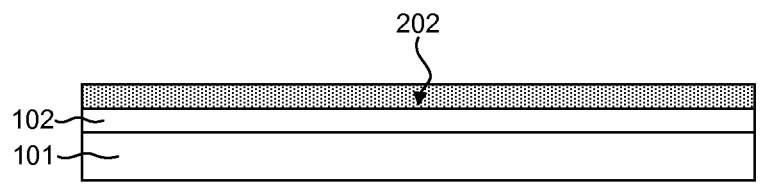
Figure 3A:
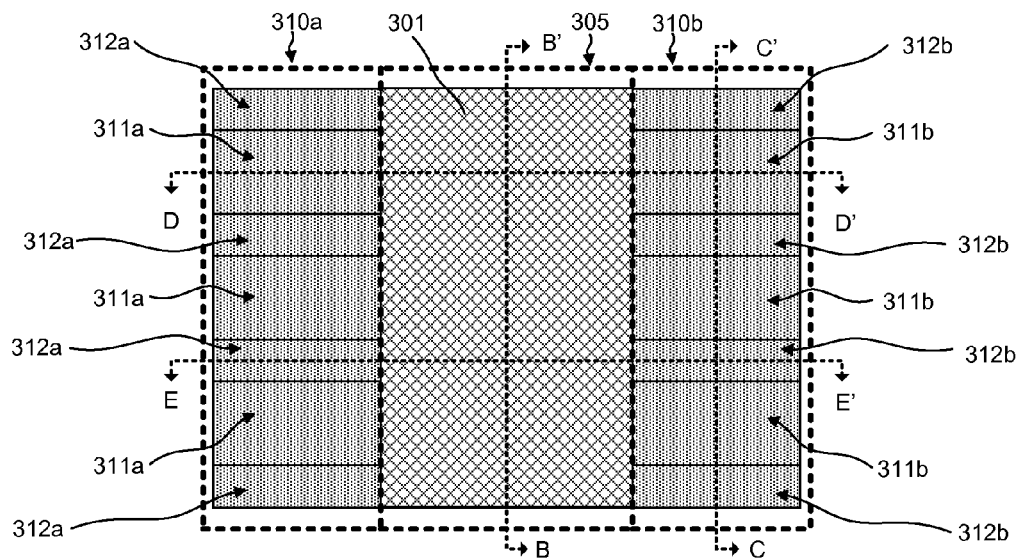
FIGS. 3A-3E depict depositing a sacrificial gate over body regions of the fins formed in FIGS. 2A-2E.
Figure 3B:
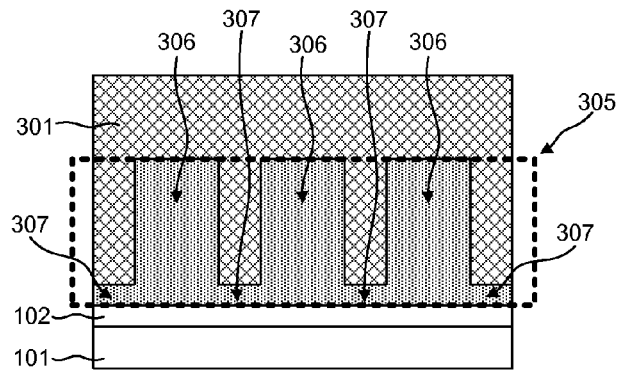
Figure 3C:
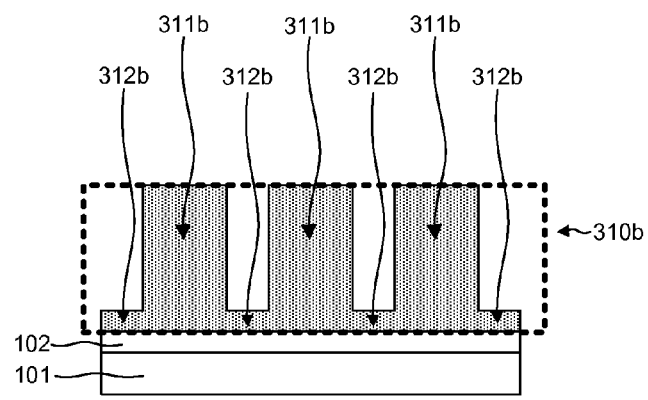
Figure 3D:
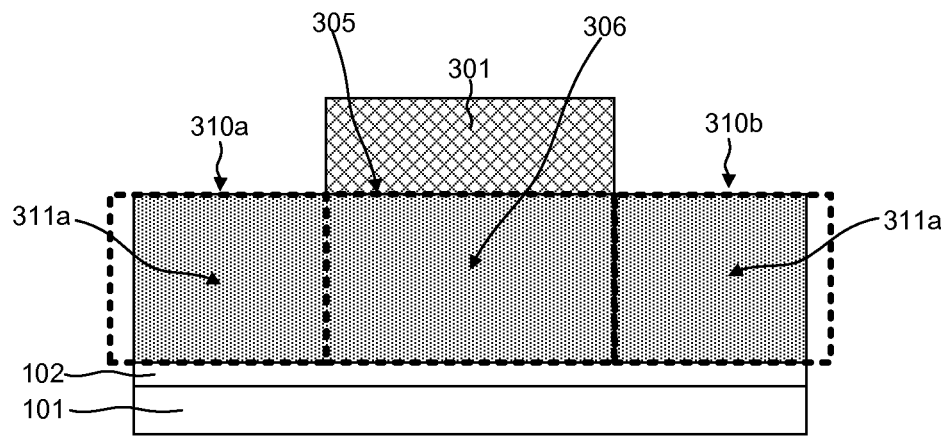
Figure 3E:
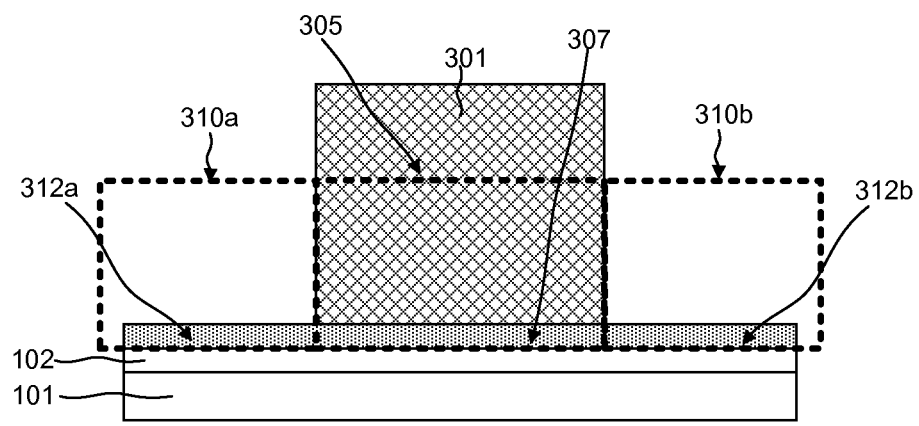
Figure 4A:
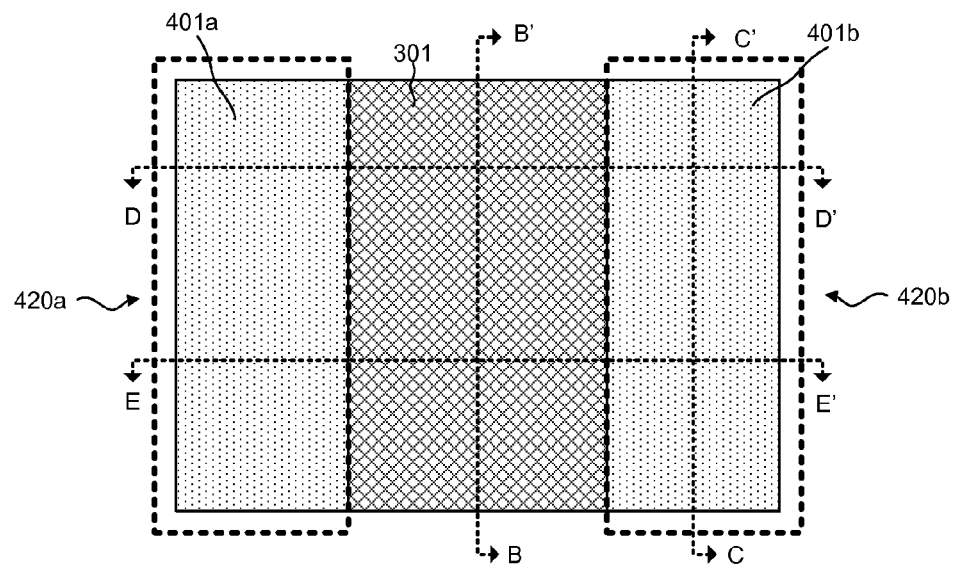
FIGS. 4A-4E depict merging the portions of the fins not covered by the sacrificial gate formed in FIGS. 3A-3E.
Figure 4B:
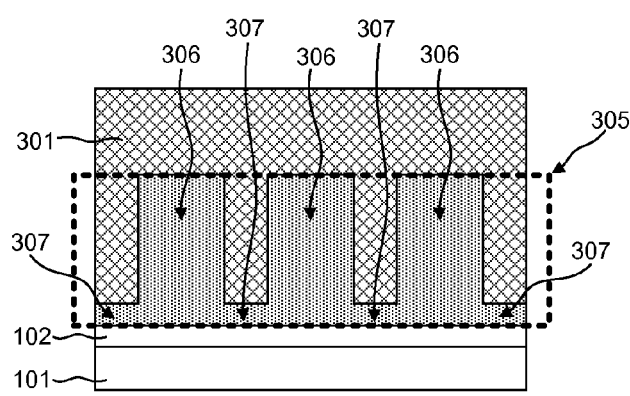
Figure 4C:
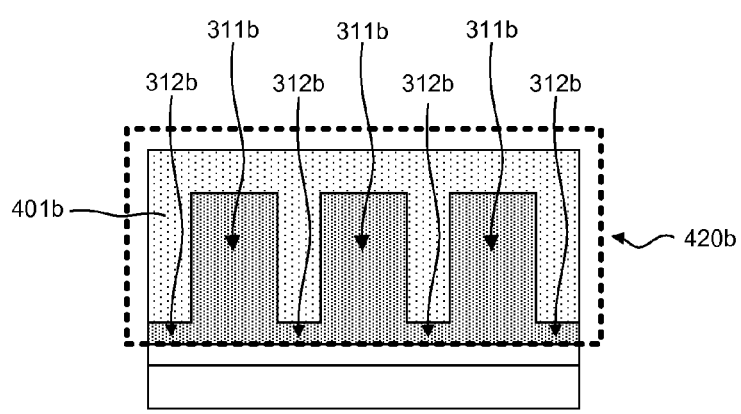
Figure 4D:
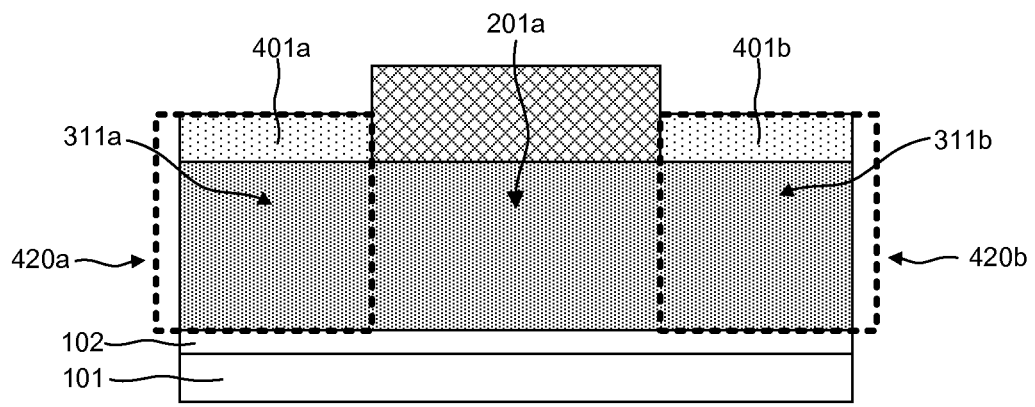
Figure 4E:
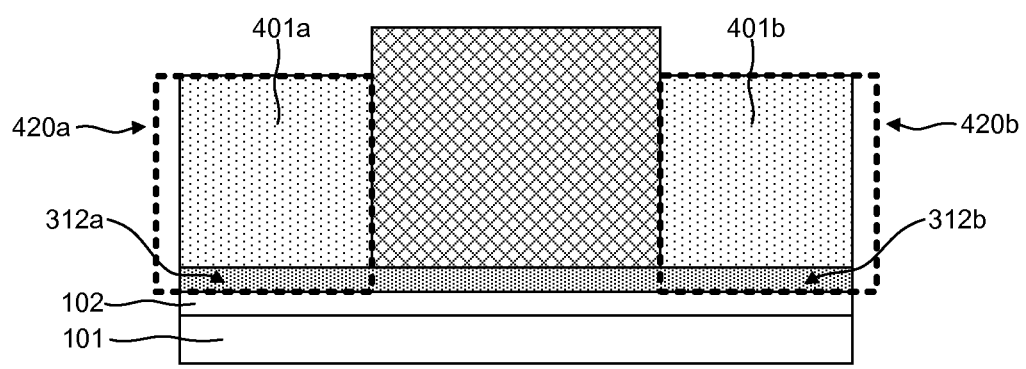

Figures with the suffix "A" are top-down views of an exemplary structure. Figures with the suffix "B", "C", "D", or "E" are vertical cross-sectional views of the exemplary structure along the plane indicated by dashed line B-B', C-C', D-D', or E-E', respectively, of the corresponding figure with the same numeric label and the suffix "A."

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring to FIGS. 1A-1E, a semiconductor-on insulator (SOI) substrate 100 is provided. The SOI substrate 100 may further include a handle substrate 101, a buried insulator layer 102, and a semiconductor substrate layer 103. The handle substrate 101 may be made of any semiconductor material including, but not limited to: silicon, germanium, silicon-germanium alloy, carbon-doped silicon, carbon-doped silicon-germanium alloy (SiGe:C), and compound (e.g. III-V and II-VI) semiconductor materials. Non-limiting examples of compound semiconductor materials include gallium arsenide, indium arsenide, and indium phosphide. The buried insulator layer 102 may be formed from any of several dielectric materials. Non-limiting examples include, for example, oxides, nitrides, oxynitrides of silicon, and combinations thereof. Oxides, nitrides and oxynitrides of other elements are also envisioned. In addition, the buried insulator layer 102 may include crystalline or non-crystalline dielectric material. The buried insulator layer 102 may be 100-500 nm thick, preferably about 200 nm. The semiconductor substrate layer 103 may be made of any of the several semiconductor materials possible for the handle substrate 101. In general, the handle substrate 101 and the semiconductor substrate layer 103 may include either identical or different semiconducting materials with respect to chemical composition, dopant concentration and crystallographic orientation. The semiconductor substrate layer 103 may be p-doped or n-doped with a dopant concentration in the range of $1\times10^{15}$-$1\times10^{18}$/cm$^3$, preferably about $1\times10^{15}$. The semiconductor substrate layer 103 may be 50-300 nm thick, preferably about 100 nm.

Referring to FIGS. 2A-2E, fins 201 are formed by removing material from the semiconductor substrate layer 103 (FIGS. 1A-1E), for example by a photolithography process followed by an anisotropic etching process such as reactive ion etching (RIE). The process used to remove material from semiconductor the substrate layer 103 should not penetrate the semiconductor substrate layer 103 completely (i.e., the etching process should not expose the buried insulator layer 102), so that the fins 201 remain joined by inter-fin semiconductor regions 202. In some embodiments, the fins 201 may have a height of approximately 25-30 nm, and a width of approximately 10 nm, while the inter-fin semiconductor regions 202 may have a height of approximately 5 nm, or 15-20% of the height of the fins 201, and a width of approximately 30 nm. In some embodiments, a hard mask layer (not shown) may be incorporated into the etching process to protect the fins 201 during their formation, and also during subsequent processing steps, such as the sacrificial gate removal process discussed below in conjunction with FIGS. 8A-8E. While the depicted embodiment includes three fins, it will be understood that other embodiments may include two or more fins.

Referring to FIGS. 3A-3E, a sacrificial gate 301 may be formed over a central portion of fins 201. The sacrificial gate 301 may be made of, for example, a polysilicon material and formed using known deposition techniques known in the art. Formation of the sacrificial gate 301 divides the fins into three regions, a body region 305, and end regions 310a and 310b. The body region 305 includes fin bodies 306 and inter-fin bodies 307. The end region 310a includes fin ends 311a and inter-fin ends 312a. The end region 310b includes fin ends 311b and inter-fin ends 312b. The sacrificial gate 301 may further include one or more spacers (not shown) formed around the sacrificial gate 301 to separate the sacrificial gate 301 from the source/drain regions formed in FIGS. 4A-6E. If included, the spacers may be made of, for example, silicon nitride or silicon oxynitride. The spacer may be formed by depositing a conformal layer of dielectric material, such as oxides, nitrides or oxynitrides followed by etching. The spacer (not depicted) may have a width ranging from 1 nm to 10 nm, typically ranging from 1 nm to 5 nm.

Referring to FIGS. 4A-4E, merge layers 401a and 401b may be formed over the end regions 310a and 310b (FIGS. 3A-3E). The merge layers 401a and 401b should be made of a material with substantially similar etch properties as those of the fins 201. In embodiments where the fins 201 (FIGS. 2A-2E) are made of a silicon-containing semiconductor material, the merge layers 401a and 401b may be formed, for example, by epitaxial growth or deposition of silicon or silicon-germanium. After formation of the merge layers 401a and 401b, merged fin regions 420a and 420b includes the merge layers 401a and 410b, the fin ends 311a and 311b, and the inter-fin ends 312a and 312b.

Referring to FIGS. 5A-5E, the merged fin regions 420a and 420b (FIGS. 4A-4E) are etched to form source/drain base regions 510a and 510b using an etching process such as, for example, RIE. In some embodiments, the sacrificial gate 301 may include a protective cap (not shown) made of, for example, silicon nitride, to protect the sacrificial gate 301 from damage while the merged fin regions 420a and 420b are etched. The source/drain base region 510a may include remaining portions 512a of the merge layer 401a (FIGS. 4A-4E), remaining portions 511a of the fins ends 311a (FIG. 3A), and the inter-fin ends 312a. The source/drain base region 510b may include remaining portions 512b of the merge layer 401b, remaining portions 511b of the fins 311b (FIG. 3A), and the inter-fin ends 312b. In some embodiments, the etch process may remove all of the merge layers 401a and 401b. In such embodiments (not shown), the source/drain base regions 510a and 510b include only the remaining portions 511a and 511b of the fins ends 311a and 311b (FIG. 3A), and the inter-fin ends 312a and 312b, respectively. Further, the etching process may remove some portions of the inter-fin ends 312a and 312b.

Figure 5A:
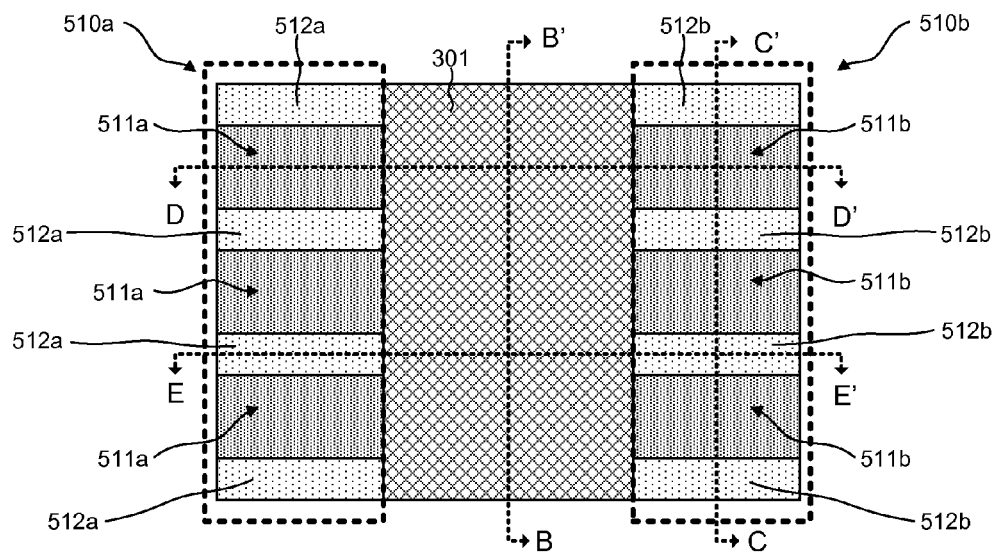
FIGS. 5A-5E depict etching the merged ends of the fins as formed in FIGS. 4A-4E to form source/drain base regions with top flat surfaces to support source/drain regions.
Figure 5B:
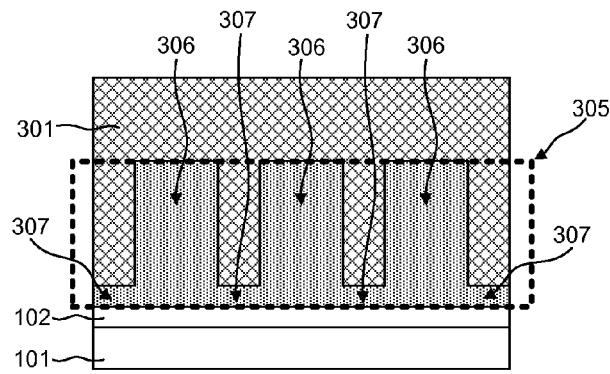
Figure 5C:
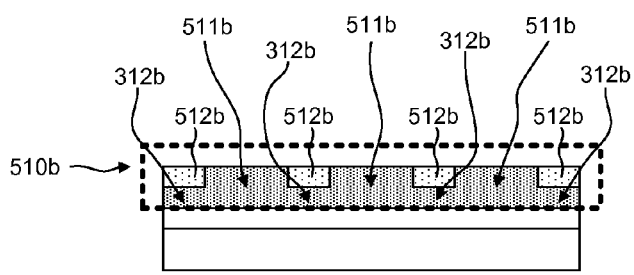
Figure 5D:
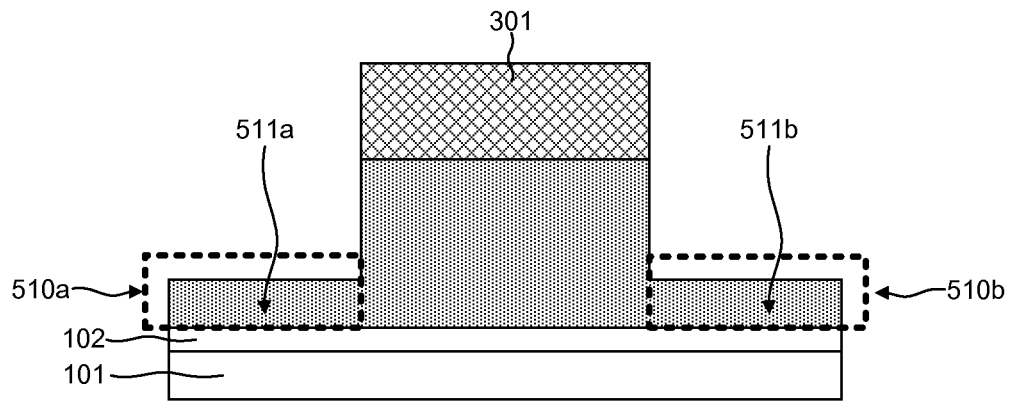
Figure 5E:
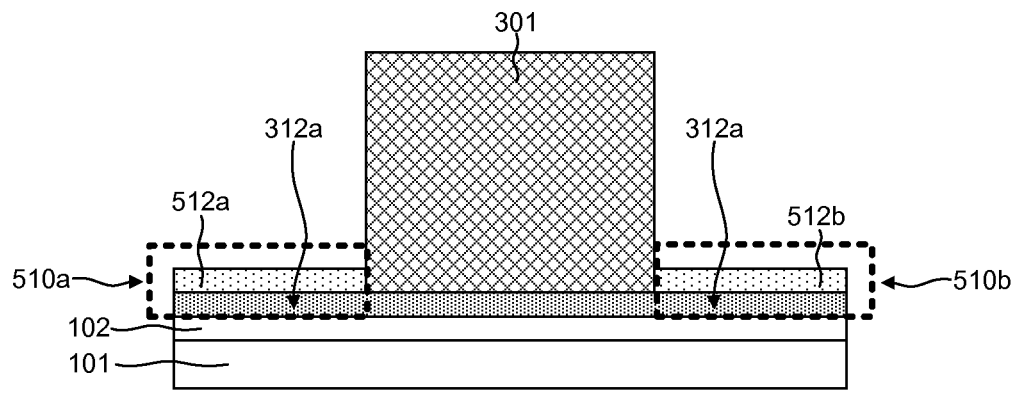
Figure 6A:
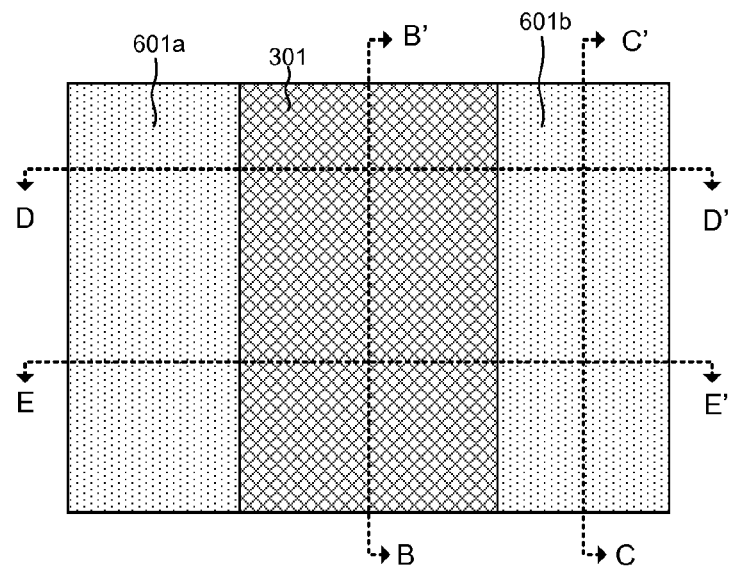
FIGS. 6A-6E depict forming source/drain regions on the flat surfaces of the source/drain base regions formed in FIGS. 5A-5E.
Figure 6B:
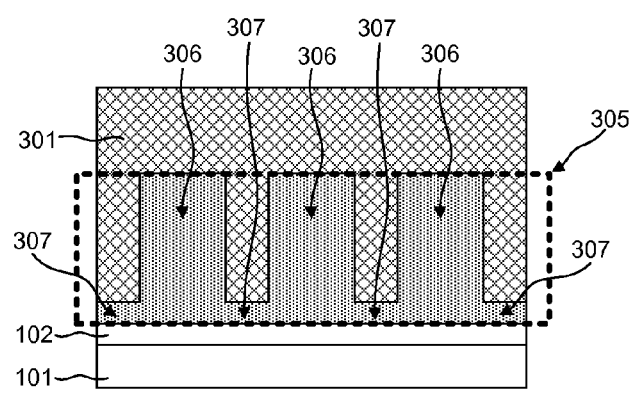
Figure 6C:
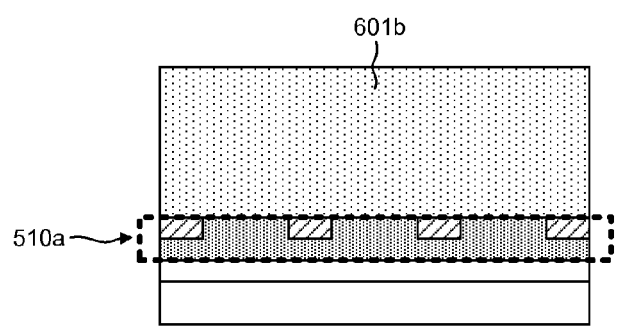
Figure 6D:
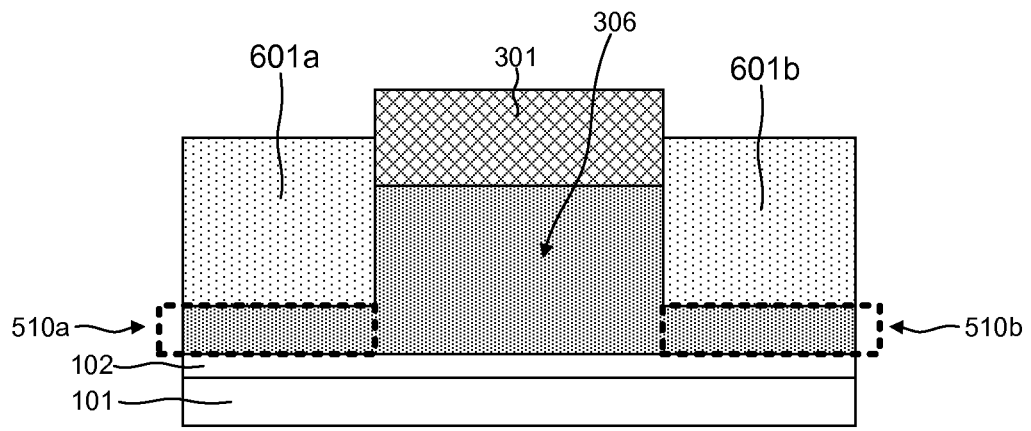
Figure 6E:
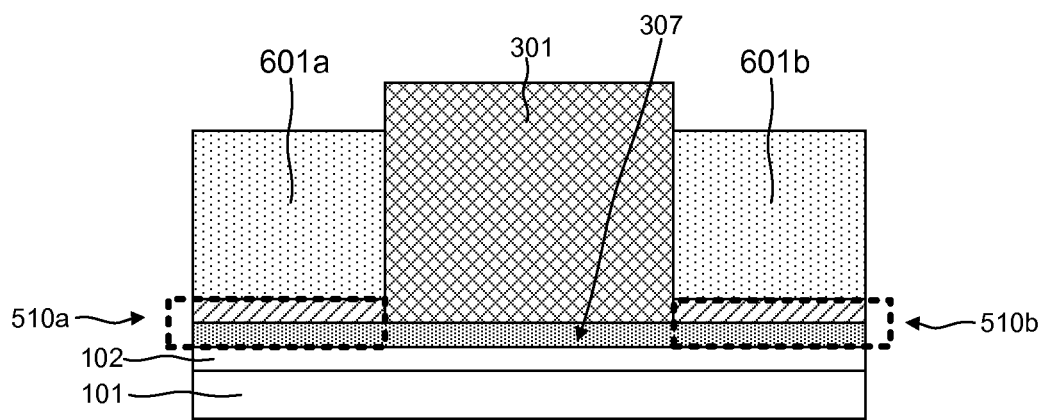
Figure 7A:
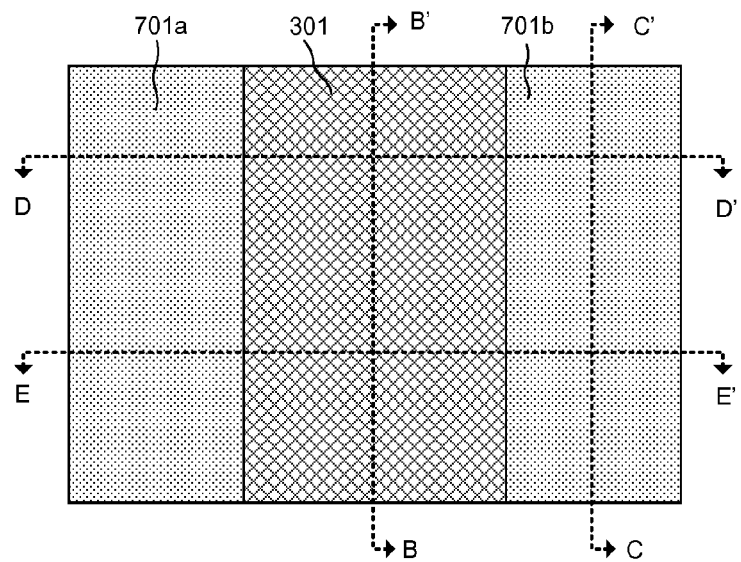
FIGS. 7A-7E depict forming protective layers over the source/drain regions formed in FIGS. 6A-6E.
Figure 7B:
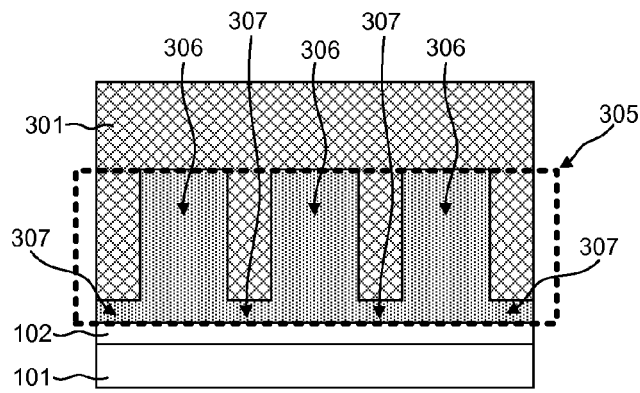
Figure 7C:
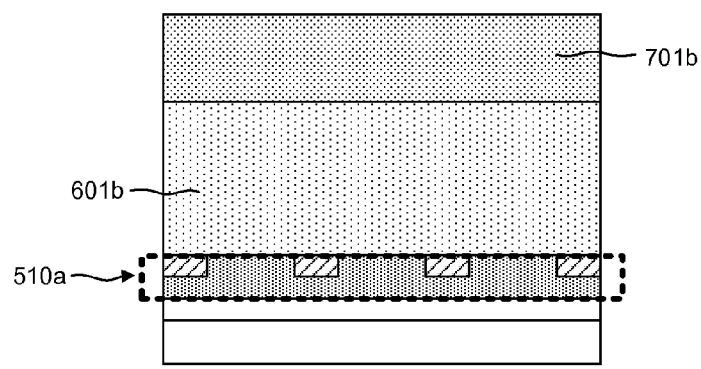
Figure 7D:
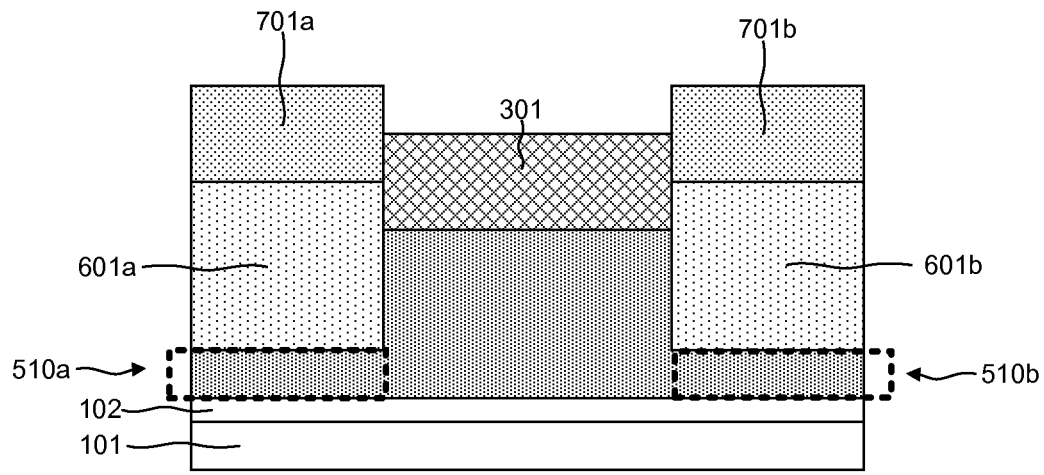
Figure 7E:
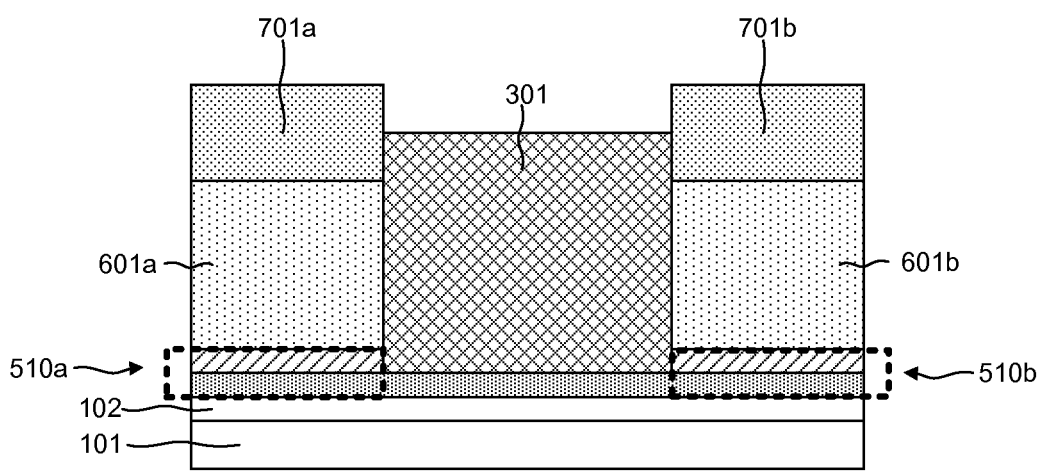

Referring particularly to FIG. 5C, the source/drain base regions 510a and 510b may have a substantially flat top surface and may have a thickness of about less then approximately 5 nm, preferably 3-4 nm. In later fabrication steps, source/drain regions may be formed on the top surface of the source/drain base regions 510a and 510b. By growing the source/drain regions on the substantially uniform surface of the source/drain base regions 510a and 510b, rather than the fin ends 311a and 311b directly, it may be possible to form more uniform source/drain regions with a consistent crystallographic orientation and doping while also preventing the formation of defects such as voids and facets. For example, in some embodiments, the source/drain base regions 510a and 510b may have a uniform (001) plane capable of supporting even silicon growth from a single plane, whereas growing source/drain regions directly on the fin ends 311a and 311b (FIG. 3A) may result in voiding and faceting where growth fronts from multiple planes meet. Further, the uniformity of the source/drain regions 510a and 510b allows for easier introduction of stress or strain into the source/drain regions.

Referring to FIGS. 6A-6E, source/drain regions 601a and 601b are formed on top of the source/drain base regions 510a and 510b, respectively. The source/drain regions 601a and 601b may be formed by, for example, epitaxially growing silicon on the top surface of the source/drain base regions 510a and 510b. For NMOS finFETs (i.e. finFETs with source/drains with n-type dopants), the source/drain regions 601a and 601b may be made of, for example, silicon or silicon carbide with a doping concentration of about $1\times10^{20}$ to about $8\times10^{20}$/cm$^3$ of arsenic or phosphorus. For PMOS finFETs finFETs (i.e. finFETs with source/drains with p-type dopants), the source/drain regions 601a and 601b may be made of, for example, silicon or silicon germanium with a doping concentration of $1 \times 10^{20}$-$8 \times 10^{20}$/cm$^3$ of boron. The source/drain regions 601a and 601b may have a thickness of about 40-70 nm, preferably 50-60 nm.

Referring to FIGS. 7A-7E, protective layers 701a and 701b are formed above the source/drain regions 601a and 601b, respectively. The protective layers 701a and 701b may be capable of preventing any substantial damage to the source/drain regions 601a and 601b during subsequent processing steps, such as the etching processes discussed below in conjunction with FIGS. 8A-8E and 9A-9E. The protective layers 701a and 701b may be made of, for example, silicon dioxide, silicon nitride, SiCOH, SiLK, or porous dielectrics. Further, the protective layers 701a and 701b may be formed by any known method in the art including, for example, chemical vapor deposition or other known deposition techniques.

Referring to FIGS. 8A-8E, sacrificial gate 301(FIG. 7A-7E) is removed to form a gate recess region 801. In embodiments where the sacrificial gate 301 includes at least one spacer (not shown), the gate removal technique and or spacer material may be such that the spacer remains and may define the outer boundary of the gate recess region 801. The gate recess region 801 includes both the space between and the space above the fin bodies 306 and will be filled with metal gate after the fin bodies 306 are separated (FIG. 9A-9E). The sacrificial gate 301 may be removed by known etching techniques including, for example, RIE.

Figure 8A:
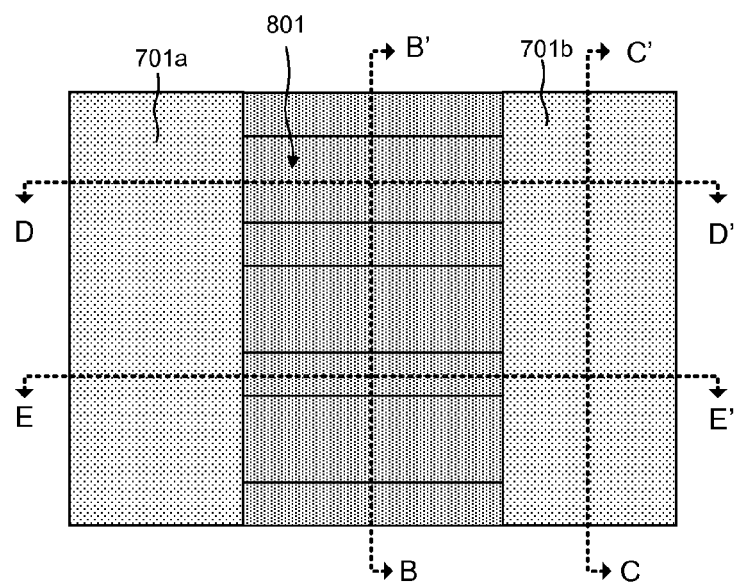
FIGS. 8A-8E depict removing the sacrificial gate formed in FIGS. 3A-3E from the body regions of the fins.
Figure 8B:
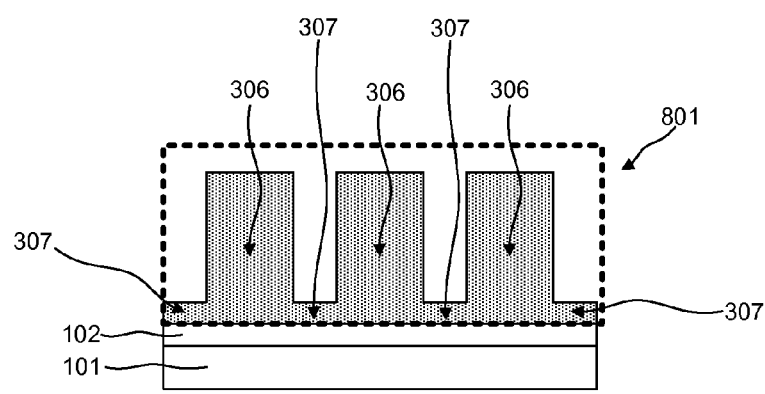
Figure 8C:
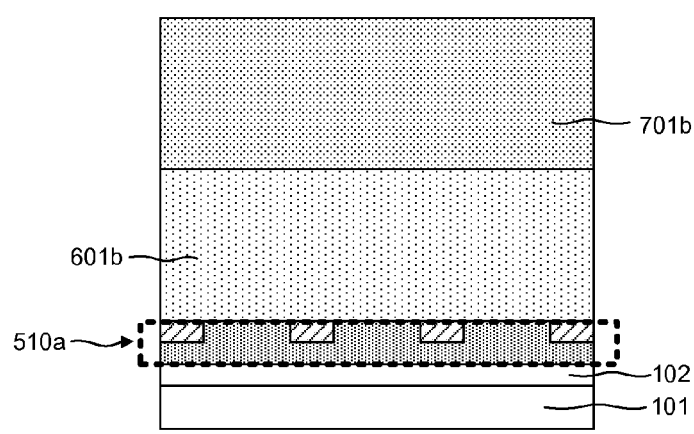
Figure 8D:
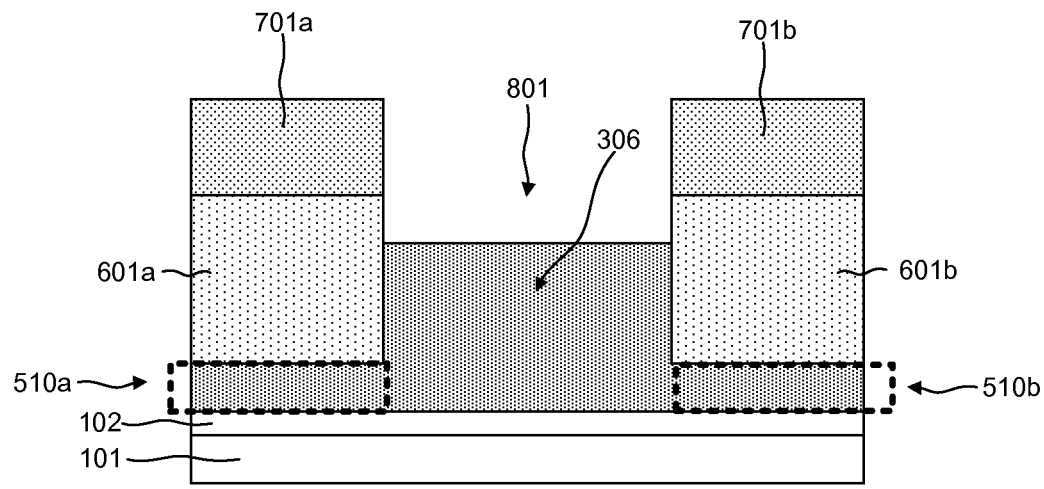
Figure 8E:
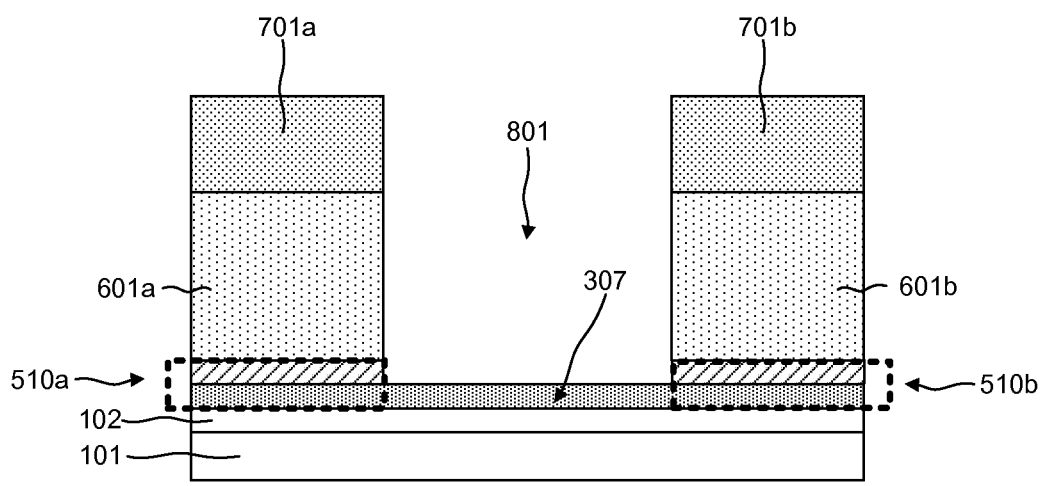
Figure 9A:
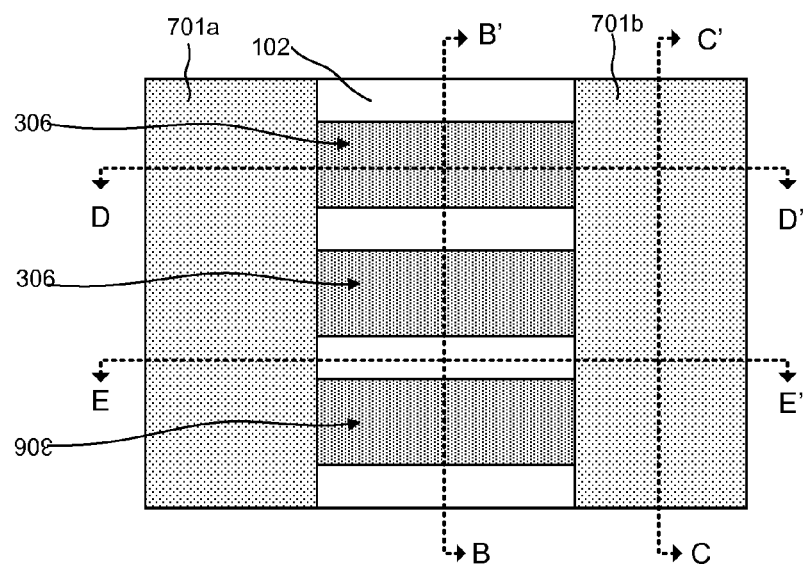
FIGS. 9A-9E depict separating the body regions of the fins by removing the inter-fin semiconductor regions.
Figure 9B:
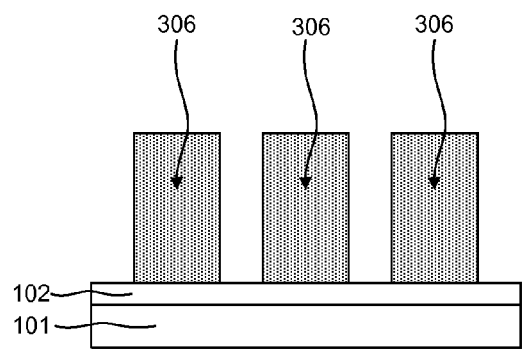
Figure 9C:
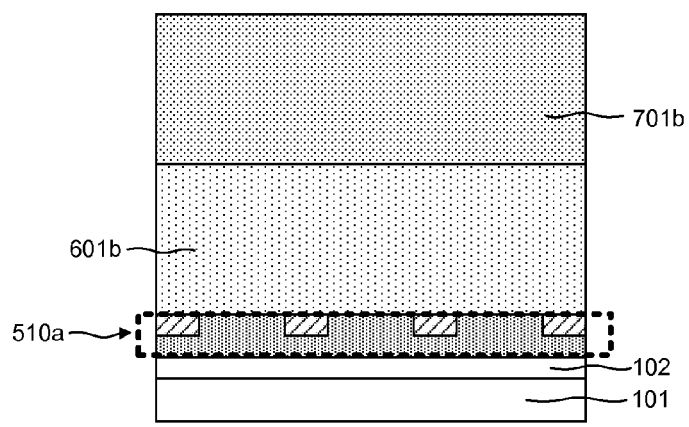
Figure 9D:
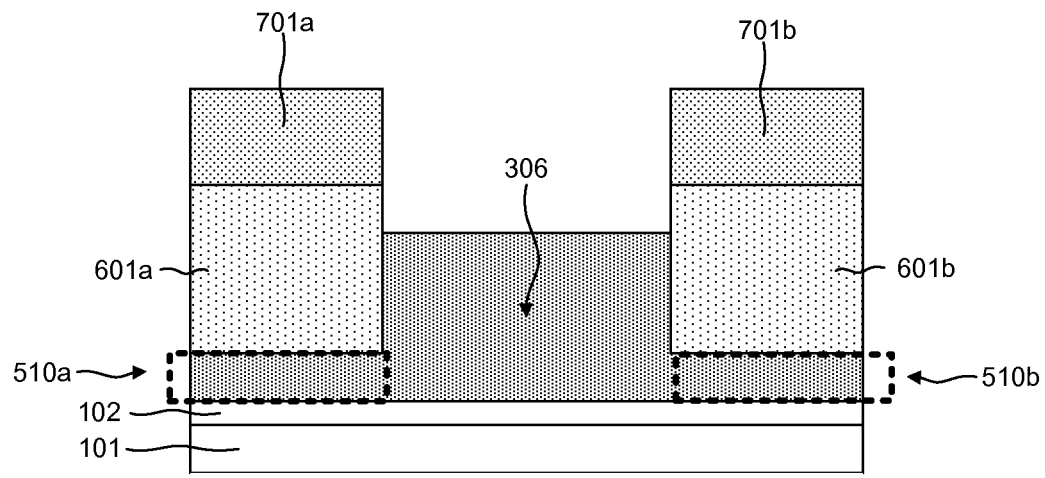
Figure 9E:
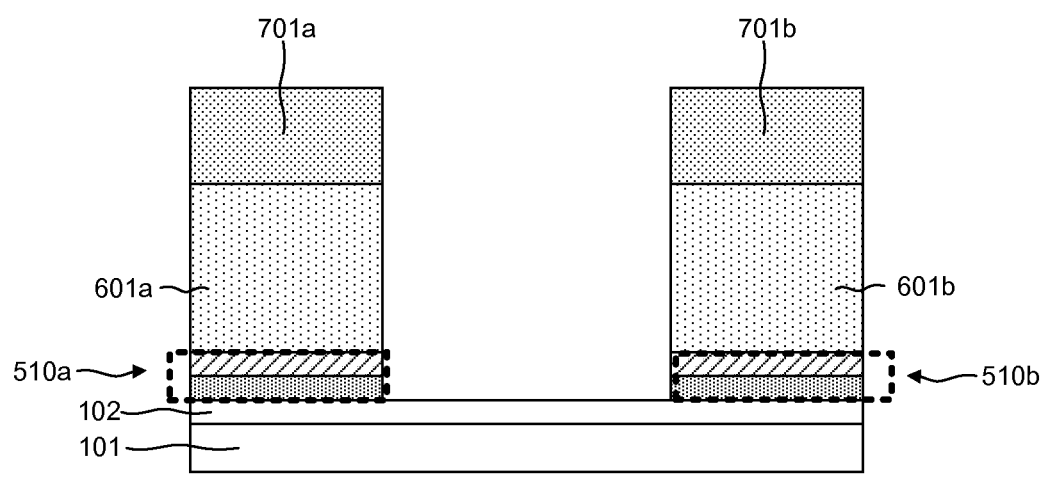

Referring to FIGS. 9A-9E, the fin bodies 306 may be separated by removing the inter-fin bodies 307 (FIG. 8B). Inter-fin bodies may be removed by any known etching process, including for example, RIE. In some embodiments, a single etching process may be used to remove the sacrificial gate 301 and remove the inter-fin bodies 307. While etching the inter-fin bodies 307, some material may be removed from the fin bodies 306. To account for this, the fins 201 may be initially formed taller than ultimately desired (See FIGS. 2A-2E for formation of the fins 201). In some embodiments, a hard mask (not shown) can be formed on top of the fin bodies 306 during fin formation (shown in FIG. 2A-2E) to prevent loss of fin height during inter-fin body removal. Alternatively, the inter-fin bodies 307 may be removed by a thermal agglomeration process. The thermal agglomeration process may remove the inter-fin bodies 307 by causing the inter-fin bodies 307 to evaporate at high temperature under an ultra-high vacuum. After removal of the inter-fin bodies 307, the buried insulator layer 102 may be exposed between each fin body 306 and each fin body 306 may not be in contact with any other fin body 306 in the gate recess region 801.

After the fin bodies 306 are separated, a metal gate may be formed in the gate recess region 801 using any known gate-last process. For example, the gate-last process may include depositing in the gate recess region 801 a gate dielectric layer, one or more work-function metals, and a metal gate electrode (not shown). The gate dielectric layer may be made of, for example, silicon dioxide, tantalum nitride, or any other known high-k dielectric. Potential work-function metals may include may be made of, for example, titanium nitride, tantalum, tantalum nitride, or titanium-aluminum and may be 1 nm to 50 nm thick, preferably 1 nm to 10 nm. The metal gate electrode may be made of, for example, copper, tungsten, or aluminum. Other embodiments may include more or less metal depending on the application and types of device being formed. The composition of each layer may also vary and the process of selecting the material for each layer is known in the art.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure comprising:
    forming a plurality of semiconductor fins joined by a plurality of inter-fin semiconductor regions;
    depositing a sacrificial gate over a center portion of each of the plurality of fins, wherein the sacrificial gate divides each of the plurality of fins into a body region covered by the sacrificial gate, a first end, and a second end separated from the first end by the body region and the sacrificial gate also divides each of the plurality of inter-fin semiconductor regions into a body region covered by the sacrificial gate, a first end, and a second end separated from the first end by the body region;
    forming a first merge layer over the first end of each of the plurality of fins to form a first merged fin region, the first merged fin region comprising the first merge layer, the first end of each of the plurality of fins, and the inter-fin semiconductor regions between the first ends of the plurality of fins;
    forming a second merge layer over the second end of each of the plurality of fins to form a second merged fin region, the second merged fin region comprising the second merge layer, the second ends of the plurality of fins, and the inter-fin semiconductor regions between the second ends of the plurality of fins;
    etching a portion of the first merged fin region to form a first source/drain base region;
    etching a portion of the second merged fin region to form a second source/drain base region;
    forming a first source/drain region on the first source/drain base region; and
    forming a second source/drain region on the second source/drain base region.

2. The method of claim 1, wherein the plurality of inter-fin semiconductor regions have a height of approximately 15 to 20 percent of the height of the plurality of semiconductor fins.

3. The method of claim 1, wherein forming the plurality of semiconductor fins comprises partially etching a semiconductor layer on the insulator to form a plurality of semiconductor fins, wherein the semiconductor fins remain joined by a plurality of inter-fin semiconductor regions comprised of unetched portions of the semiconductor layer.

4. The method of claim 1, wherein the first merge layer and the second merge layer comprise a material with substantially similar etch properties as that of the plurality of semiconductor fins.

5. The method of claim 1, wherein forming a first source/drain region on the first source/drain base region comprises growing epitaxial semiconductor material on the first source/drain base region and forming a second source/drain region on the second source/drain base region comprises growing epitaxial semiconductor material on the second source/drain base region.

6. The method of claim 1, wherein the first source/drain base region and the second source/drain base region each have a substantially flat top surface and a thickness of less than approximately 5 nm.

7. The method of claim 1, wherein etching at least a portion of the first merged fin region fully removes the first merge layer and wherein etching at least a portion of the second merged fin region fully removes the second merge layer.

8. The method of claim 1, wherein etching at least a portion of the first merged fin region removes a portion of the inter-fin semiconductor regions between the first ends of the plurality of fins, and wherein etching at least a portion of the second merged fin region removes at least a portion of the inter-fin semiconductor regions between the second ends of the plurality of fins.

9. The method of claim 1, further comprising:
 removing the sacrificial gate to expose the body region of each of the plurality of fins and the body region of each of the plurality of inter-fin semiconductor regions; and
 removing the body region of each of the plurality of inter-fin semiconductor regions.

10. The method of claim 9, wherein the exposed portions of the plurality of inter-fin semiconductor regions are removed by an anisotropic etching process or by a thermal agglomeration process.

11. A method of merging semiconductor fins comprising:
 depositing a merge layer over the semiconductor fins, wherein the merge layer is made of the same material as the semiconductor fins;
 etching the merge layer and the semiconductor fins to form a base region having a substantially flat top surface; and
 growing a semiconductor layer on the top surface of the base region.

12. The method of claim 11, wherein the merge layer has substantially similar etch properties as the semiconductor fins.

13. The method of claim 11, wherein the base region has a thickness of less than approximately 5 nm.

\* \* \* \* \*